United States Patent [19]

Aoi

[11] Patent Number: 5,084,125
[45] Date of Patent: Jan. 28, 1992

[54] APPARATUS AND METHOD FOR PRODUCING SEMICONDUCTOR SUBSTRATE

[75] Inventor: Nobuo Aoi, Takatsuki, Japan

[73] Assignee: Matsushita Electric Industrial Co., Ltd., Osaka, Japan

[21] Appl. No.: 579,415

[22] Filed: Sep. 10, 1990

[30] Foreign Application Priority Data

Sep. 12, 1989 [JP] Japan .................................. 1-236149

[51] Int. Cl.$^5$ .................................................. H01L 21/00
[52] U.S. Cl. .................................. 156/345; 118/715; 118/719; 118/723
[58] Field of Search .............. 156/345; 118/715, 719, 118/723

[56] References Cited

U.S. PATENT DOCUMENTS

| | | | |
|---|---|---|---|
| 4,668,337 | 5/1987 | Sekine et al. .......................... | 156/643 |
| 4,716,852 | 1/1988 | Tsujii et al. .......................... | 118/723 |
| 4,857,139 | 8/1989 | Tashiro et al. ...................... | 156/345 |
| 4,910,042 | 3/1990 | Hokynar .............................. | 118/715 |

FOREIGN PATENT DOCUMENTS

| | | | |
|---|---|---|---|
| 60-130125 | 11/1975 | Japan ................................. | 156/345 |
| 60-52014 | 3/1985 | Japan ................................. | 118/715 |
| 62-20321 | 7/1985 | Japan ................................. | 156/345 |

Primary Examiner—Richard Bueker
Assistant Examiner—George A. Goudreau
Attorney, Agent, or Firm—Panitch Schwarze Jacobs & Nadel

[57] ABSTRACT

A semiconductor substrate production in which the treatment of semiconductor substrates and the removal of deposits previously formed on the used wall portion are simultaneously performed, so that at least two wall portions alternately constitute the substrate treating chamber after cleaning, thereby continuing the production of semiconductor substrates without breaks for the removal of detrimental deposits.

10 Claims, 4 Drawing Sheets

APPARATUS AND METHOD FOR PRODUCING SEMICONDUCTOR SUBSTRATE

BACKGROUND OF THE INVENTION

1. Field of the Invention

The present invention relates generally to the production of semiconductor substrates, and more particularly to an apparatus and a method for producing semiconductor substrates protecting against unwanted deposits formed on a treating chamber. Hereinafter, the producing apparatus and method will be referred to as the apparatus and the method, respectively.

2. Description of the Prior Art

In producing semiconductor substrates by a reactive ion etching (RIE) method or a chemical vapor depositing (CVD) method, the inside walls of the apparatus are liable to deposits which consist of $SiO_2$, and/or organic polymers. These deposits emit impure gases which not only stain the semiconductor substrates but also break a gaseous equilibrium in the apparatus, thereby unfavorably affecting the quality thereof. In addition, the deposits are likely to peel off onto the semiconductor substrates and spoil the patterns thereon, thereby reducing the yields of semiconductor substrates. As the patterns on the semiconductor substrates become finer and finer, the reduced yields become more serious.

Accordingly, one practise for removing the deposits is to stop the operation periodically so as to clean the deposits from the inside walls of the apparatus with an organic solvent (the wet cleaning method), and another practise is to disassemble the apparatus into components parts and clean then by ultrasonic wave (the ultrasonic cleaning method). A further practise is to prevent impurities from being deposited on the inside wall of the apparatus by use of plasma (the plasma cleaning method).

These three practises are disadvantageous in that the operation must be stopped for each cleaning, thereby reducing the operating speed. In mass-producing process the frequent suspensions of the operation reduces the productivity even though each break is a short term.

SUMMARY OF THE INVENTION

The semiconductor producing apparatus of the present invention, which overcomes the above-discussed and numerous other disadvantages and deficiencies of the prior art, comprises a vacuum chamber including a substrate treating section and a cleaning section, a movable paritition including at least a first wall portion and a second wall portion, a driving means for moving the partition so that the first wall portion or the second wall portion is alternately positioned in the substrate treating section and in the cleaning section.

In a preferred embodiment, the partition is cylindrical, and the first and second wall portions are vertically movable so as to be alternately positioned in the substrate treating section and the cleaning section.

In another preferred embodiment, the partition is rotary, and the first and second wall portions are rotated so as to be alternately positioned in the substrate treating section and the cleaning section.

In a further preferred embodiment, the apparatus is a dry etching apparatus.

In a still further embodiment, the apparatus is a plasma chemical vapor deposition apparatus.

In another preferred embodiment, the deposits on one of the wall portions are removed by a plasma cleaning method in the cleaning section.

According to another aspect of the present invention, the semiconductor substrate producing apparatus comprises a vacuum chamber including a substrate treating section having a pair of electrodes for treating substrates, and a cleaning section having a pair of electrodes for removing deposits on the wall portions, a movable partition including at least a first wall portion and a second wall portion, a driving means for moving the partition so as to position one of the wall portions in the substrate treating section and the other wall portion in the cleaning section so that while a substrate is being electrically treated in the substrate treating section with one of the wall portions, deposits on the other wall portion are cleaned in the cleaning section.

According to a further aspect of the present invention, the semiconductor substrate producing apparatus comprises a vacuum chamber including a substrate treating section including a pair of first electrodes and a pair of cleaning sections each located adjacent to the substrate treating section, each cleaning section including a pair of second electrodes, a movable cylindrical partition including at least a first wall portion and a second wall portion, a driving means for moving the partition so as to position one of the wall portions in the substrate treating section and the other wall portion in the cleaning section so that the wall portions constitute a substrate treating chamber and a cleaning chamber together with the respective electrodes, thereby ensuring that while a substrate is being treated in the substrate treating chamber by the first electrodes, the deposits on the wall portion in the cleaning chamber are cleaned by discharge occurring between the second electrodes.

According to a still further aspect of the present invention, the semiconductor substrate producing apparatus comprising a vacuum chamber including a substrate treating section including a pair of first electrodes and a cleaning section including a pair of second electrodes, a movable cylindrical partition including a first wall portion and a second wall portion, a driving means for moving the partition so as to position one of the wall portions in the substrate treating section and the other wall portion in the cleaning section so that the wall portions constitutes a substrate treating chamber and a cleaning chamber together with the respective electrodes, thereby ensuring that while a substrate is being treated in the substrate treating chamber by the first electrodes, the deposits on the wall portion in the cleaning chamber are cleaned by discharge occurring between the second electrodes.

According to another aspect of the present invention, the semiconductor substrate producing method using an apparatus comprising a vacuum chamber including a substrate treating section and a cleaning section, a movable partition including at least a first wall portion and a second wall portion, a driving means for moving the partition reciprocally to and from the substrate treating section and the cleaning section, the method comprising the steps of simultaneously conducting the treatment of the semiconductor substrate in the substrate treating section enclosed by the first wall portion and the cleaning of the second wall portion used in the previous substrate treatment in the cleaning section, exchanging the used first wall portion for the cleaned second wall portion, and simultaneously conducting the treatment of a next semiconductor substrate in the substrate treating section enclosed with the cleaned second wall portion, and the cleaning of the first wall portion used in the previous substrate treatment in the cleaning section.

In a preferred embodiment, the wall portions are cleaned with plasma.

Thus, the invention described herein makes possible the objective of achieving a semiconductor substrate production in which the treatment of semiconductor substrates and the removal of deposits previously formed on the used wall portion are simultaneously performed, thereby continuing the production of semiconductor substrates without breaks for the removal of detrimental deposits.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENT

Example 1

Figure 1:
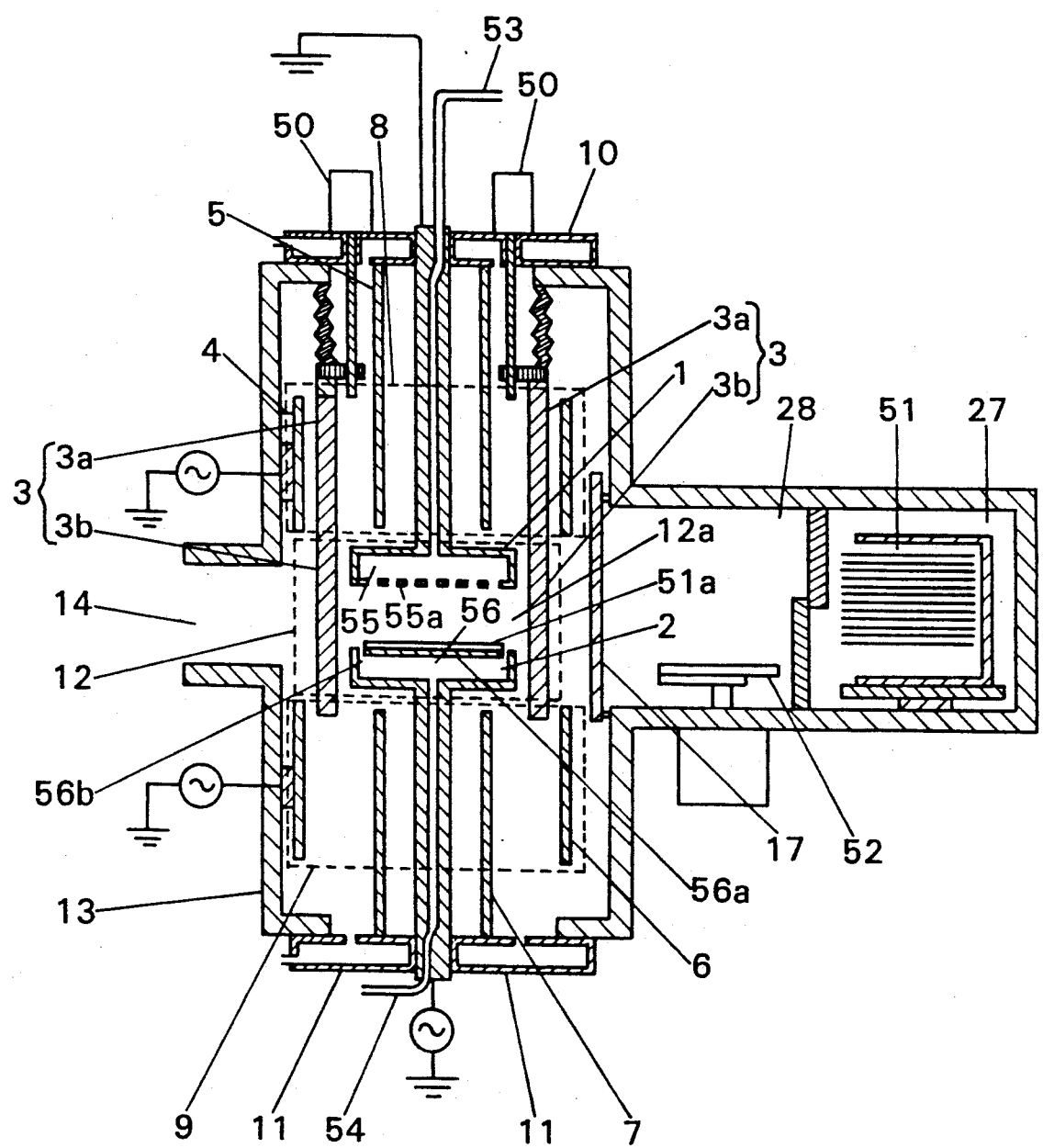
FIG. 1 is a vertical cross-section through a semiconductor producing apparatus according to the present invention.

Referring to FIG. 1, which illustrates a parallel plate type apparatus for carrying out a reactive ion etching method, commonly called a single wafer process, the apparatus includes a vacuum chamber 13, accommodating a substrate treating section 12 and cleaning sections 8 and 9 each located adjacent to the substrate treating section 12. The reference numeral 3 denotes a cylindrical movable partition including wall portion 3a and 3b preferably made of quartz. The partition 3 is vertically moved by driving means 50 such as electric motors, hydraulic cylinders, pneumatic cylinders so that the wall portions 3a and 3b are alternately positioned in the substrate treating section 12 and either of the cleaning sections 8 or 9. In FIG. 1, the wall portion 3b is positioned in the substrate treating section 12 and the wall portion 3a is positioned in the upper cleaning section 8.

The vacuum chamber 13 is provided with an auxiliary chamber 28 and a storage chamber 27 both connected to a vacuum source (not shown). The auxiliary chamber 28 is provided with a shifting arm 52 whereby a substrate 51a is taken out of a stack of substrates 51. The auxiliary chamber 28 is partitioned by a movable gate valve 17 from the vacuum chamber 13.

The vacuum chamber 13 is provided with a gas inlet plate 10 at an upper section and a gas inlet plate 11 at a lower section each mounted in an airtight manner. Each gas inlet plate 10 and 11 are a hollow plate having gas inlet pores through which a gas such as oxygen gas is introduced into the vacuum chamber 13. The supplied gas is discharged through an outlet 14 connected to the vacuum source (not shown).

The substrate treating section 12 has a pair of electrodes 1 and 2 of a planar type arranged in parallel. The electrodes 1 and 2 are kept airtight against the partition 3 with packings (not shown). Thus the two electrodes 1 and 2 and the wall portion 3a or 3b constitute a closed substrate treating chamber 12a. The upper electrode 1 is grounded, and the lower electrode 2 is connected to an a.c. power source of 13.56 MHz (not numbered). A treating substrate 51a is placed on a plate 56a including a porous portion 56b, the plate 56a forming a part of the lower electrode 2.

The upper electrode 1 includes a hollow space 55 having a porous portion 55a and a duct 53 through which a gas used for the reactive ion etching is introduced into the inside of the upper electrode 21 and distributed into the substrate treating chamber 12a through the porous portion 55a.

The lower electrode 2 includes a hollow space 56 having a plate 56a and a duct 54 through which a gas used in the reactive ion etching is discharged out of the inside of the substrate treating chamber 12a through the porous portion 56b of the plate 56a.

The upper cleaning section 8 accommodate cylindrical electrodes 4 and 5 concentrically arranged. The partition 3 (that is, the wall portion 3a) is vertically movable between the electrodes 4 and 5. Likewise, the lower cleaning section 9 accommodates cylindrical electrodes 6 and 7 concentrically arranged. The partition 3 (that is, the wall portion 3b) is vertically movable between the electrodes 6 and 7. The cylindrical electrodes 5 and 7 are grounded, and a high frequency voltage such as 13.56 MHz is applied to the cylindrical electrodes 4 and 6. Deposits on the wall portions 3a and 3b are removed by plasma generated between the cylindrical electrodes 4 and 5, and between the cylindrical electrodes 6 and 7.

Deposits on the walls of the substrate treating chamber 12a are removed in the following manner by employing the apparatus described above:

The partition 3 is fully raised until the lower end thereof becomes flush with the lower end of the upper cleaning section 8 so that the substrate treating chamber 12a is made ready to receive a substrate 51. The shifting arm 52 is operated to shift a substrate 51a from the stack of substrates in the storage chamber 27 and place it on the plate 56a of the lower electrode 2. Then, the partition 3 is lowered until the lower end of the wall portion 3b beocmes flush with that of the substrate treating chamber 12a with the wall portion 3a being positioned in the upper cleaning section 8. At this stage, an etching gas is intrroduced in to the substrate treating chamber 12a through the duct 53 and space 55, and voltage is applied to the lower electrode 2. In this way the substrate 51a on the plate 56a is subjected to the reactive ion etching.

After the ion etching is finished, the partition 3 is raised until the lower end thereof becomes fluch with that of the upper cleaning section 8 so that the substrate treating chamber 12a is opened so as to enable the shifting arm 52 to exchange the treated substrate 51a on the plate 56a for a fresh substrate 51 from the stack of substrates in the storage chamber 27.

Figure 2A:
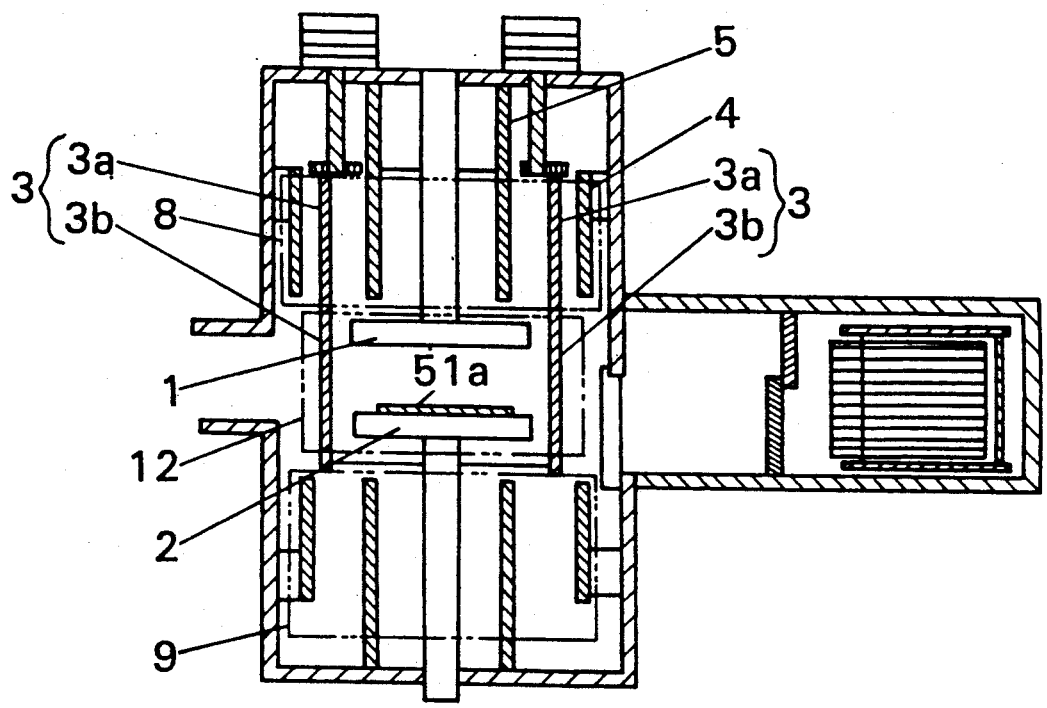
FIGS. 2(a) and (b) are explanatory views exemplifying the principle underlying the embodiment of FIG. 1.
Figure 2B:
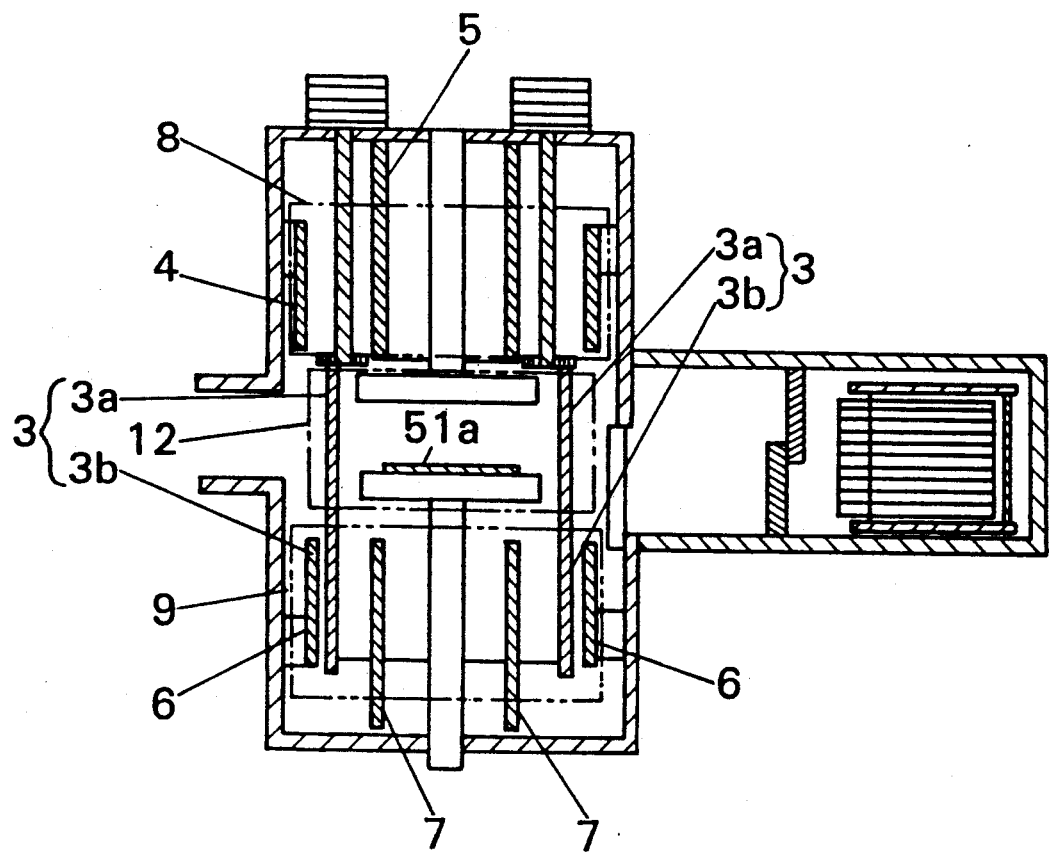

FIG. 2(b) shows that the next substrate 51a is placed on the plate 56a of the lower electrode 2, wherein, unlike the case of FIG. 2(a), the wall portion 3b is lowered until the lower end thereof becomes flush with that of the lower cleaning section 9 with the wall portion 3a being positioned in the substrate treating chamber 12a and the wall portion 3b being positioned in the lower cleaning section 9. An etching gas is introduced into the substrate treating chamber 12a through the duct 53 and the space 55 in the upper electrode 1. In addition, oxygen gas is introduced into other spaces in the vacuum chamber 13 than the substrate treating chamber 12a through the inlet plates 10 and 11. Then voltage is applied to the lower electrode 2 so as to effect the reactive ion etching on the substrate 51a on the plate 56a in the substrate treating section 12. Simultaneously, voltage is applied to the cylindrical electrode 6 so as to generate oxygen plasma, thereby removing deposits on the wall portion 3b.

After the substrate 51a is treated, the partition 3 is raised until the lower end thereof becomes flush with that of the upper cleaning section 8 so that the substrate treating section 12 is opened so as to enable the shifting arm 52 to exchange the treated substrate 51a with a fresh substrate from the stack of substrates in the storage chamber 27.

Again, the state is returned to that of FIG. 2(a), and thereafter the same procedure is repeated until a desired number of substrates are treated. In this way, the deposits on the previously used wall portion 3a or 3b are cleaned in either of the cleaning sections 8 or 9 while a fresh substrate 51a is electrically treated in the substrate treating chamber 12a with the cleaned wall portion 3b or 3a which is free from deposits, thereby securing continuous substrate treating operation.

Example 2

Figure 3:
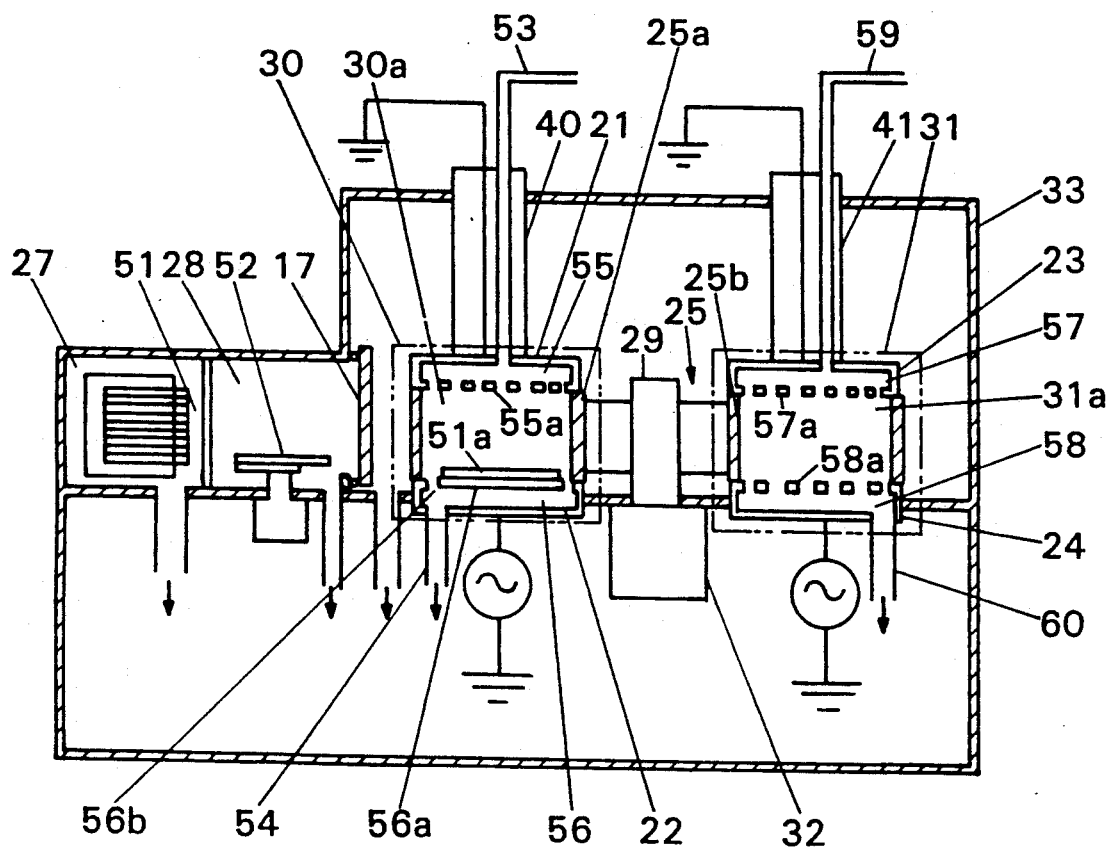
FIG. 3 is a vertical cross-section through a modified version of the semiconductor producing apparatus according to the present invention.
Figure 4:
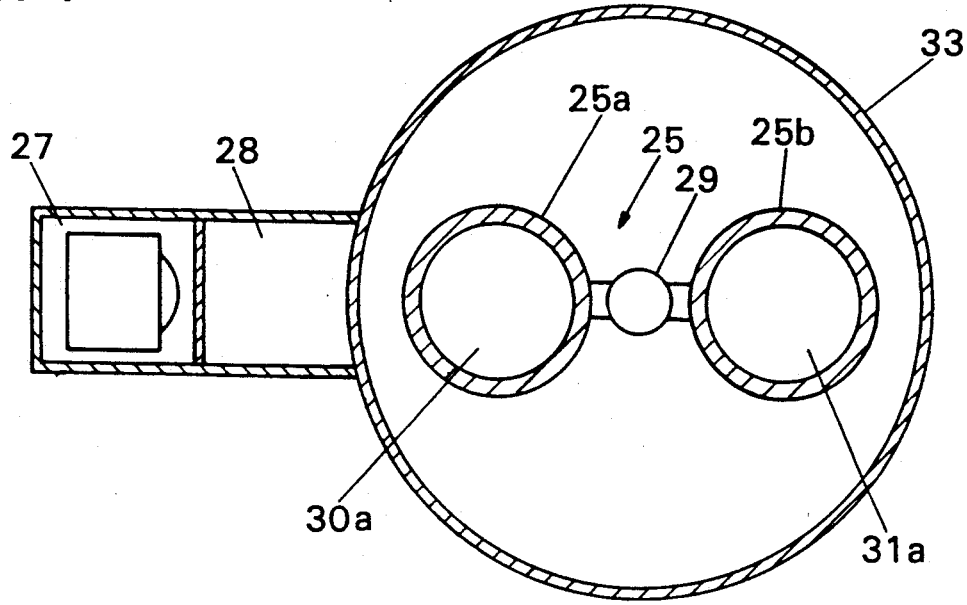
FIG. 4 is a plan view showing the apparatus of FIG. 3.

Referreing to FIGS. 3 and 4, which illustrate an apparatus for effecting a plasma CVD method, there is provided a vacuum chamber 33 including a substrate treating section 30 and a cleaning section 31. There is provided a movable cylindrical partition 25 including a first wall portion 25a and a second wall portion 25b. The partition 25 is rotated by known driving means 32.

The vacuum chamber 32 accommodates an auxiliary chamber 28 and a storage chamber 27, each connected to a vacuum source (not shown). The auxiliary chamber 28 is provided with a shifting arm 52 whereby a substrate 51a to be treated is taken out of a stack of substrates 51 in the storage chamber 27. The auxiliary chamber 28 is partitioned from the vacuum chamber 33 by a movable gate valve 17.

The substrate treating section 30 includes a pair of electrodes 21 and 22. The upper electrode 21 is vertically movable by means of a bellows type support 40, and the lower electrode 22 is fixed. The partition 25 is rotated by the driving means 32 so as to position one of the wall portions 25a and 25b in the substrate treating section 30 and the other wall portion 25b or 25a in the cleaning section 31 so that the wall portions 25a or 25b constitutes a closed substrate treating chamber 30a together with the electrodes 21 and 22.

The upper electrode 21 includes a space 55 which is connected to a duct 53. The space 55 is connected to the substrate treating chamber 30a through a porous portion 55a in a communicating manner. A gas (e.g. tetra ethoxy silane) used in the CVD method is introduced into the substrate treating chamber 30a through the duct 53, the space 55 and the porous portion 55a.

The lower electrode 22 includes a second duct 54 and a second space 56, which is connected to the substrate treating chamber 30a through a plate 56a. The used gas is withdrawn from the substrate treating chamber 30a into the second duct 54 through a porous portion 56b, and discharged outside.

The cleaning section 31 includes a pair of electrodes 23 and 24. The upper electrode 23 is vertically movable by means of a bellows type support 41, and the lower electrode 24 is fixed. As described above, when the partition 25 is rotated by the driving means 32 so as to position one of the wall portions 25a or 25b in the substrate treating section 30 and the other wall portion 25b or 25a in the cleaning section 31, the wall portions 25a or 25b constitutes a closed cleaning chamber 31a together with the electrodes 23 and 24.

The upper electrode 23 includes a space 57 which is connected to a duct 59. The cleaning chamber 31a is connected to the space 57 through a porous portion 57a in a communicating manner. A gas (e.g. $CF_4$) used for the removal of deposits is introduced into the cleaning chamber 31a through the duct 59, the space 57 and the porous portion 57a.

The lower electrode 24 includes a second duct 60 and a second space 58 which is connected to the cleaning chamber 31a through a porous portion 58a. The used gas is withdrawn from the cleaning chamber 31a into the second duct 60 through the porous portion 58a and discharged outside.

The electrodes 21 and 23 are grounded, and the electrodes 22 and 24 are connected to an a.c. voltage source (not numbered).

As shown in FIG. 3, the wall portions 25a and 25b are located at opposite sides of a rotary shaft 29 of the driving means 32 so that the mutual positions are interchangeable in accordance with the rotation of the rotary shaft 29. The driving means 32 can be an electric motor. The wall portions 25a and 25b are vertically movable in accordance with the movement of the upper electrodes 21 and 23 so that a substrate to be treated is introduced into the substrate treating chamber 30a and placed on the plate 56a of the lower electrode 22.

Figure 5A:
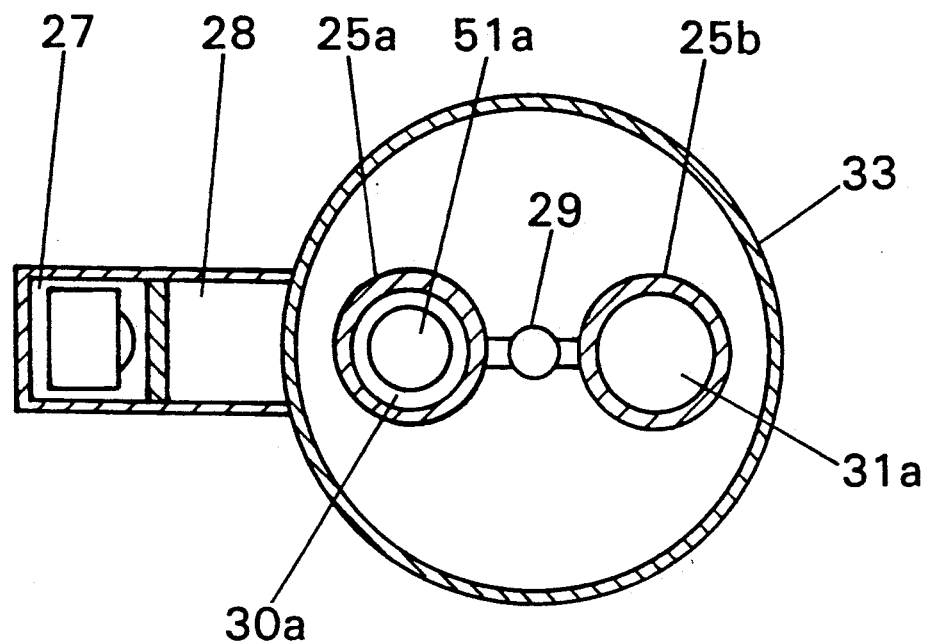
FIGS. 5(a) and (b) are explanatory views exemplifying the method of removing deposits using the apparatus of FIG. 3.

In operation, the electrodes 21, 23, and the wall portions 25a, 25b and the gate valve 17 are moved upward. Then, a substrate 51a is picked up from the stack of substrates in the storage chamber 27 by the shifting arm 52 and placed on the plate 56a of the lower electrode 22. At this stage, as shown in FIG. 5 (a), one of the wall portions 25a or 25b is positioned in the substrate treating section 30, and the other is positioned in the cleaning section 31. Then, the upper electrodes 21, 23 and the wall portions 25a, 25b are lowered to position in the substrate treating section 30, and in the cleaning section 31, respectively. Thus, the substrate treating chamber 30a and the cleaning chamber 31a are respectively constituted. A tetra ethoxy silane gas is introduced into the substrate treating chamber 30a and voltage is applied to the electrode 22 so as to deposit oxide layers on the substrate 51a on the lid 56a. The wall portion 25a is also covered with oxides.

Then, the upper electrodes 21 and 23, and the wall portions 25a and 25b are moved upward. The treated substrate 51a is exchanged for a fresh substrate from the storage chamber 37, and the partition 25 is rotated by the driving means 32 until the stained wall portion 25a is positioned in the cleaning section 31. The exchange of the treated substrate with the fresh substrate can be done after the wall portions 25a and 25b are positioned in the cleaning section 31 and the substrate treating section 30, respectively. The upper electrodes 21 and 23, and the wall portions 25a and 25b are lowered.

A tetra ethoxy silane gas is introduced into the substrate treating chamber 30a through the space 55, and a CF4 gas is introduced into the cleaning chamber 31a. Then, a.c. voltage is applied to the lower electrodes 22 and 24. In this way, while the substrate 51a is being treated in the substrate treating chamber 31a, the wall portion 25a is rid of deposits in the cleaning chamber 31a. Oxides are deposited on the wall portions 25b.

Figure 5B:
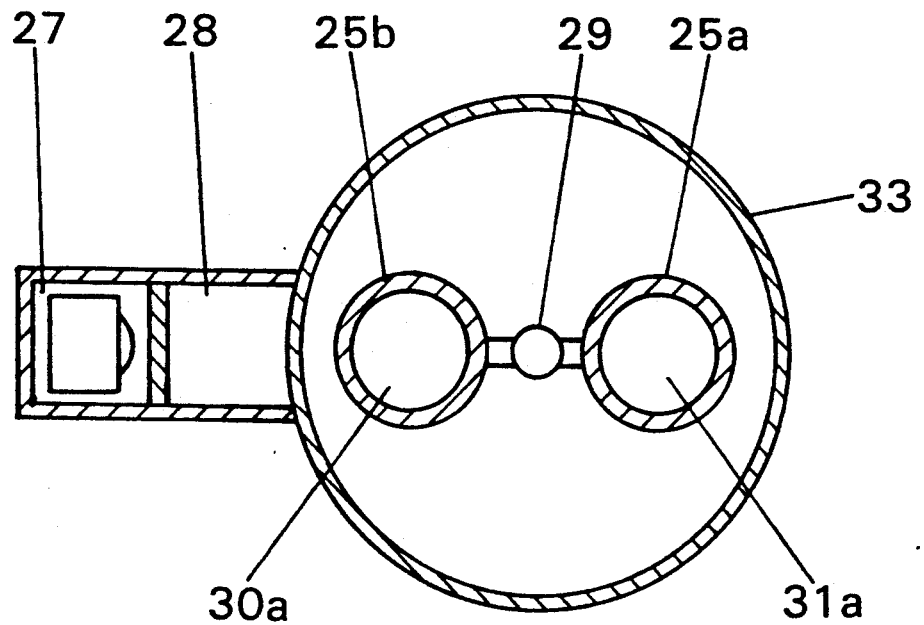

The electrodes 21, 23 and the wall portions 25a, 25b are raised, and the treated substrate 51a is exchanged for a fresh substrate from the storage chamber 27. Then, as shown in FIG. 5(b) the partition 25 is rotated until the wall portions 25a and 25b are positioned in the cleaning section 31 and the substrate treating section 30, respectively. The exchange of the treated substrate 51a with a fresh substrate 51 can be done after the partition 25 is rotated. The upper electrodes 21, 23 and the wall portions 25a, 25b are lowered.

A tetra ethoxy silane gas is introduced into the substrate treating chamber 30a through the space 55, and a CF4 gas is introduced into the cleaning chamber 31a. Then, a.c. voltage is applied to the lower electrodes 22 and 24. In this way, while the substrate 51a is being treated in the substrate treating chamber 31a, the wall portion 25a is rid of deposits in the cleaning chamber 31a.

Afterward, the same procedure is repeated until a desired number of substrates are treated. In Example 2 a single substrate treating section, a single cleaning section, and two wall portions are employed, but two or more substrate treating sections and cleaning sections, and four or more wall portions can be employed.

As is evident from the foregoing, while a substrate is electrically treated in the substrate treating chamber with one of the wall portions, deposits on the other wall portion used in the previous treatment are cleaned. After the treated substrate is exchanged by a fresh substrate, the fresh substrate is treated in the substrate treating chamber with the cleaned wall portion, and at the same time, the used wall portion is cleaned in the cleaning chamber. In this way the production of semiconductor substrates continues constantly with a clean wall portion. Thus, the productivity of semiconductor substrates is enhanced.

The apparatus can be a dry etching apparatus or a plasma CVD apparatus.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An apparatus for producing semiconductor substrates, the apparatus comprising a vacuum chamber including a substrate treating section and a cleaning section, a movable cylindrical partition including at least a first wall portion and a second wall portion, the first and second wall portions being vertically movable so as to be alternately positioned in the substrate treating section and the cleaning section, a driving means for moving the cylindrical partition so that the first wall portion or the second wall portion is alternately positioned in the substrate treating section and in the cleaning section.

2. An apparatus for producing semiconductor substrates, the apparatus comprising a vacuum chamber including a substrate treating section and a cleaning section, a rotary partition including a first wall portion and a second wall portion, the first and second wall portions being rotatable so as to be alternately positioned in the substrate treating section and the cleaning section, thereby sealing the substrate treating section and the cleaning section independently of each other, the substrate treating section and the cleaning section each including a pair of electrodes connected to an a.c. power source, and a driving means for rotating the rotary partition so that the first wall portion or the second wall portion is alternately positioned in the substrate treating section and in the cleaning section.

3. An apparatus according to claim 1, wherein the apparatus is a dry etching apparatus.

4. An apparatus according to claim 1, wherein the apparatus is a plasma chemical vapor deposition apparatus.

5. An apparatus according to claim 1, wherein the deposits on one of the wall portions are removed by a plasma cleaning method in the cleaning section.

6. An apparatus for producing semiconductor substrates, the apparatus comprising a vacuum chamber including a substrate treating section having a pair of electrodes for electrically treating substrates, and a cleaning section having a pair of electrodes for removing deposits on wall portions, a movable cylindrical partition including at least a first wall portion and a second wall portion, a driving means for moving the cylindrical partition so as to alternately position one of the wall portions in the substrate treating section and the other wall portion in the cleaning section so that while a substrate is being electrically treated in the substrate treating section with one of the wall portions, deposits on the other wall portion are cleaned in the cleaning section.

7. An apparatus for producing semiconductor substrates, the apparatus comprising a vacuum chamber including a substrate treating section including a pair of first electrodes and a pair of cleaning sections each located adjacent to the substrate treating section, each cleaning section including a pair of second electrodes, a movable cylindrical partition including at least a first wall portion and a second wall portion, a driving means for moving the partition so as to position one of the wall portions in the substrate treating section and the other wall portion in the cleaning section so that the wall portions constitute a substrate treating chamber and a cleaning chamber together with the respective electrodes, thereby ensuring that while a substrate is being treated in the substrate treating chamber by the first electrodes, the deposits on the wall portion in the cleaning chamber are cleaned by discharge occurring between the second electrodes.

8. An apparatus for producing semiconductor substrates, the apparatus comprising a vacuum chamber including a substrate treating section having a pair of first electrodes and a cleaning section having a pair of second electrodes, a rotary cylindrical partition including a first wall portion and a second wall portion, a driving means for rotating the cylindrical partition so as to alternatively position one of the wall portions in the substrate treating section and the other wall portion in the cleaning section so that the wall portions together with the respective electrodes constitute a substrate treating chamber and a cleaning chamber in such a manner as to be sealed independently of each other, thereby ensuring that while a substrate is being treated in the substrate treating chamber by the first electrodes, deposits on the wall portion in the cleaning chamber are cleaned by discharge occurring between the second electrodes.

9. An apparatus according to claim 3, wherein the apparatus is a dry etching apparatus.

10. An apparatus according to claim 3, wherein the apparatus is a plasma chemical vapor deposition apparatus.

* * * * *